(12) United States Patent
Lai

(10) Patent No.: US 7,297,011 B2
(45) Date of Patent: Nov. 20, 2007

(54) CHIP ADAPTER SEAT

(75) Inventor: Chih-Ming Lai, Xindian (TW)

(73) Assignee: Giga-Gyte Technology Co. Ltd., Taipei (TW)

( * ) Notice: Subject to any disclaimer, the term of this patent is extended or adjusted under 35 U.S.C. 154(b) by 0 days.

(21) Appl. No.: 11/459,486

(22) Filed: Jul. 24, 2006

(65) Prior Publication Data

US 2007/0218742 A1   Sep. 20, 2007

(30) Foreign Application Priority Data

Mar. 17, 2006   (TW) ............................... 95204451 U

(51) Int. Cl.
*H01R 13/62* (2006.01)

(52) U.S. Cl. .................................................. 439/331

(58) Field of Classification Search ................ 439/331, 439/485, 73, 733.1
See application file for complete search history.

(56) References Cited

U.S. PATENT DOCUMENTS

| | | | | |
|---|---|---|---|---|
| 4,286,837 | A * | 9/1981 | Yasutake et al. ............ | 439/637 |
| 4,515,424 | A * | 5/1985 | Sakurai ...................... | 439/325 |
| 4,560,216 | A * | 12/1985 | Egawa ....................... | 439/41 |
| 4,758,176 | A * | 7/1988 | Abe et al. .................. | 439/331 |
| 4,887,969 | A * | 12/1989 | Abe ........................... | 439/73 |
| 5,074,798 | A * | 12/1991 | Carter ........................ | 439/72 |
| 5,210,440 | A * | 5/1993 | Long .......................... | 257/675 |
| 5,244,404 | A * | 9/1993 | Kishi et al. ................ | 439/331 |
| 5,245,277 | A   | 9/1993 | Nguyen | |
| 5,387,120 | A * | 2/1995 | Marks et al. .............. | 439/331 |
| 5,460,538 | A * | 10/1995 | Ikeya ......................... | 439/331 |
| 5,470,247 | A * | 11/1995 | Fuchigami ................. | 439/264 |
| 5,562,473 | A * | 10/1996 | Ikeya et al. ................ | 439/331 |
| 5,791,915 | A * | 8/1998 | Kubo .......................... | 439/73 |
| 7,125,286 | B2 * | 10/2006 | Wang et al. ................ | 439/637 |
| 2003/0057980 | A1 | 3/2003 | Murphy et al. | |

FOREIGN PATENT DOCUMENTS

| | | |
|---|---|---|
| EP | 0512714 A1 | 11/1992 |
| GB | 1602320 A | 11/1981 |
| GB | 2205007 A | 11/1988 |
| WO | 9901447 | 4/1999 |

OTHER PUBLICATIONS

UK search report dated Oct. 31, 2007.

* cited by examiner

*Primary Examiner*—Tho D. Ta

(57) ABSTRACT

A chip adapter seat for positioning and connecting to a chip includes an insulating seat body, a plurality of terminals and a pressing element. The insulating seat body has an accommodating space for arranging the chip. On the corresponding sides of the accommodating space, a plurality of terminal-receiving grooves is provided to correspond to the chip pins. Each terminal-receiving groove is provided with a terminal therein. On end of the each terminal is electrically connected to the chip pin, and the other end thereof projects from the outside of the periphery of the insulating seat body. The pressing element is connected above the accommodating space of the insulating seat body for pressing the chip in the accommodating space of the insulating seat body. With the above arrangement, another chip can be rapidly changed without complicated detaching process when the chip is damaged. Further, the repairing procedure becomes simple and convenient for use to connect various kinds of chips with different sizes, thereby increasing the versatility.

18 Claims, 8 Drawing Sheets

CHIP ADAPTER SEAT

BACKGROUND OF THE INVENTION

1. Field of the Invention

The present invention relates to a chip adapter seat, and in particular to a chip adapter seat for positioning and connecting a chip.

2. Description of Prior Art

A desktop or laptop computer is constituted by a hardware and software. The hardware usually comprises a motherboard, CPU, memory, hard disk driver, display card, sound card, power supply and the like. The hard driver stores a system software and data. The memory is used to be a buffer for reading data so as to accelerate the processing speed of the hardware system. On the motherboard, various kinds of chips, connectors and electronic elements having different sizes and specifications are arranged and soldered. The chip is used for storing or performing the computation. After a long-term operation, the occurrence of damage is inevitable. Further, when the computer is to be upgraded and thus needed to change part of chips, it is necessary to detach the chip from the motherboard. Therefore, it is an important issue to provide an adapter seat capable of easily detaching the chip from the motherboard.

As shown in FIG. 1, in a combined structure of a conventional chip and a circuit board, a plurality of pins 11a project outwardly from two corresponding end faces of the chip 10a. At the corresponding positions on the circuit board 20a, a plurality of connecting pieces are provided and each connecting piece is used for abutting and connecting to each pin 11a of the chip 10a. In assembling, the connecting pieces on the circuit board 20a are coated with soldering agent such as solder paste. The chip 10a is positioned to a position in which the circuit board 20a is to be located. Each pin 11a of the chip 10a corresponds to each connecting piece of the circuit board 20a. Then, a soldering operation is performed to combine the chip 10a with the circuit board 20a.

However, in the combined structure of the chip and the circuit board, there are still some problems existing in actual practice. Since the chip 10a is operated for a long time, the chip may be inevitably burned down and damaged due to the overload current or unsteady current. In the repairing procedure, each soldering point should be welded one by one, and then the residue of soldering agent is removed. After this, another new chip 10a is made to connect with the circuit board 20a. In this way, not only various kinds of special tools are necessary, but also the time for repairing is increased. Further, if the computer is to be upgraded and needed to change part of chips, it is also necessary to perform the above-mentioned complicated procedure. Therefore, the practicability and economic efficiency thereof are greatly reduced.

In view of the above the drawbacks, the inventor proposes the present invention to overcome the above problems based on his expert experiences and deliberate researches.

SUMMARY OF THE INVENTION

The present invention is to provide a chip adapter seat capable of rapidly changing another chip without complicated detaching process when the chip is damaged. With this arrangement, the repairing procedure becomes simple and convenient. Further, it can be used to connect to various kinds of chips having different sizes, thereby to increase the versatility.

The present invention provides a chip adapter seat for positioning and connecting to a chip, which comprises an insulating seat body, a plurality of terminals and a pressing element. The insulating seat body has an accommodating space for arranging the chip. On the corresponding sides of the accommodating space, a plurality of terminal-receiving grooves is provided to correspond to the chip pins. Each terminal-receiving groove is provided with a terminal therein. On end of the each terminal is electrically connected to the chip pin, and the other end thereof projects from the outside of the periphery of the insulating seat body. The pressing element is connected above the accommodating space of the insulating seat body for pressing the chip in the accommodating space of the insulating seat body.

The present invention provides a chip adapter seat for positioning and connecting to a chip, which comprises an insulating seat body, a plurality of terminals and a pressing element. The insulating seat body has an accommodating space. On the corresponding sides of the accommodating space, a plurality of terminal-receiving grooves is provided at identical internals. Each terminal-receiving groove is provided with a terminal therein. On end of the each terminal projects from the bottom surface of the accommodating space of the insulating seat body, and the other end thereof projects from the outside of the periphery of the insulating seat body. The pressing element is connected above the accommodating space of the insulating seat body.

BRIEF DESCRIPTION OF THE DRAWINGS

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

The detailed description and the technical contents of the present invention will be explained with reference to the accompanying drawings. However, it should be understood that the drawings are illustrative but not used to limit the scope of the present invention.

Figure 1:
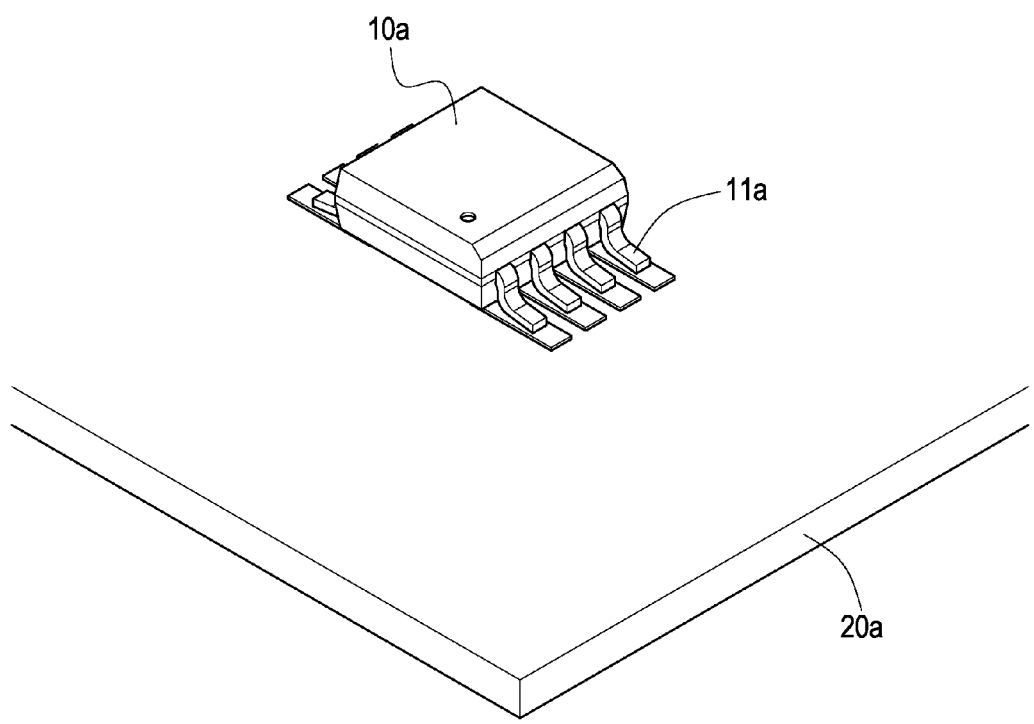
FIG. 1 is an assembled view showing a conventional chip and circuit board.
Figure 2:
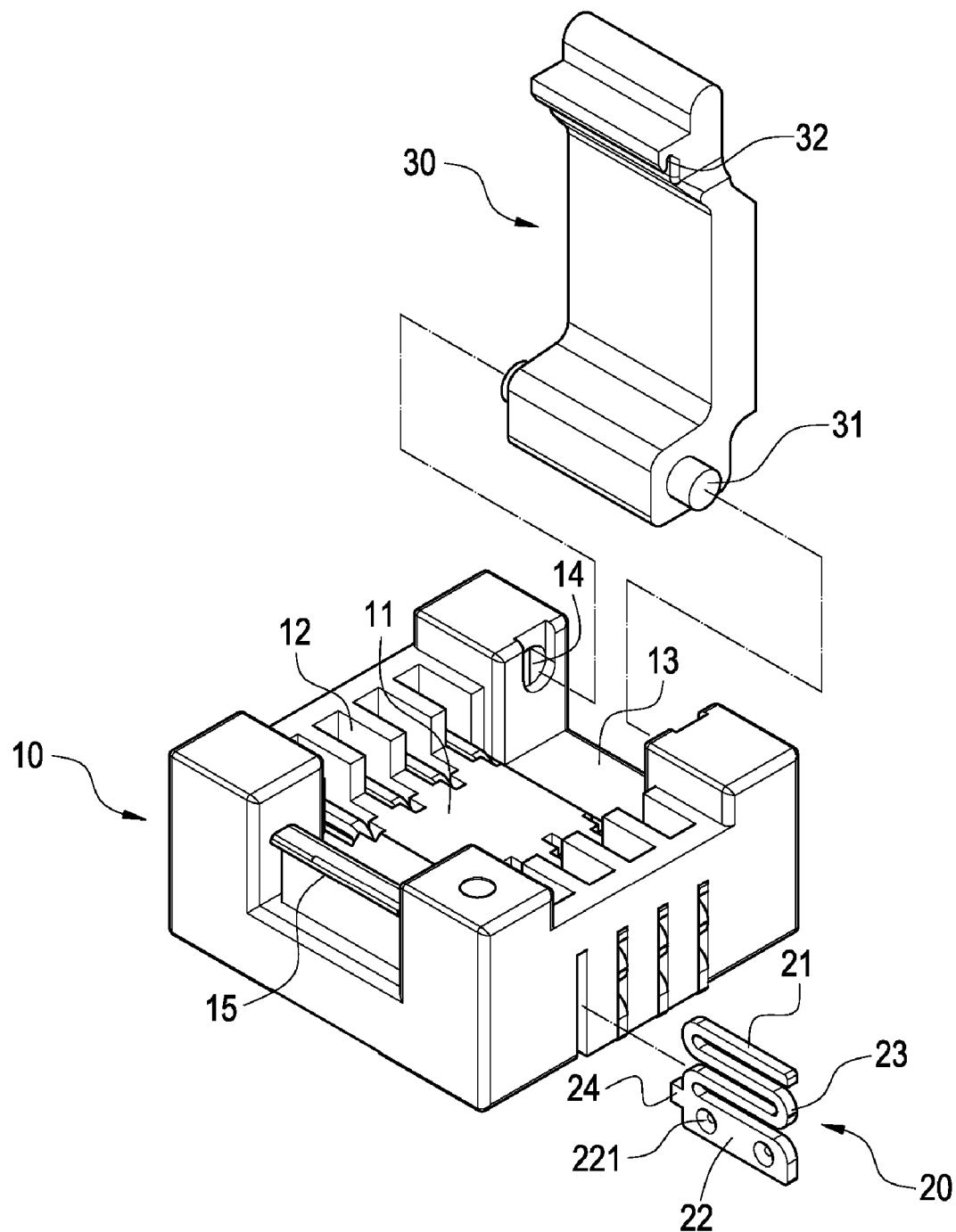
FIG. 2 is a partially exploded perspective view of the present invention.
Figure 3:
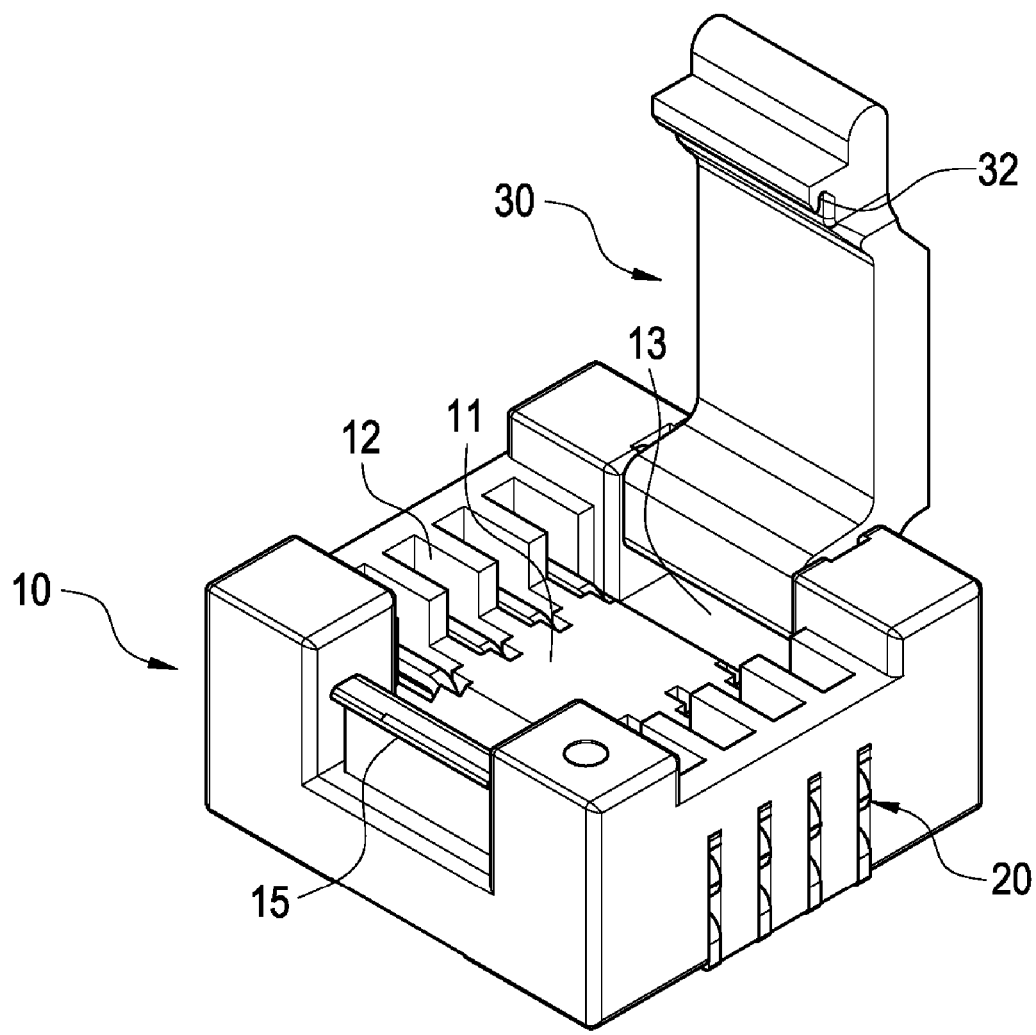
FIG. 3 is an assembled view of the present invention.

With reference to FIG. 2 and FIG. 3, which are a partially exploded perspective view and an assembled view of the present invention, respectively. The present invention provides a chip adapter seat comprising an insulating seat body 10, a plurality of terminals 20 and a pressing element 30.

The insulating seat body 10 is formed into a shape similar to rectangular. The middle of the top surface of the insulating seat body is recessed downwardly to form with an accommodating space 11. On the corresponding left and right sides of the accommodating space 11 of the insulating seat body 10, a plurality of terminal-receiving grooves 12 is arranged at identical intervals. The rear of the insulating seat body 10 is formed with a recessed trough 13. On the left and right side wall faces of the recessed trough 13, each connecting hole 14 is provided. In the middle of the side of the insulating seat body 10 opposing to the recessed trough 13 is provided with a locking hook 15.

Each terminal is a conductor and provided in the terminal-receiving groove 12 of the insulating seat body 10. The terminal 20 comprises a contacting segment 21, a soldering segment 21 and a connecting segment 23 formed between the contacting segment 21 and the soldering segment 22. The soldering segment 22 projects from the outside of the periphery of the insulating seat body 10. Fixing holes 221 are provided on the soldering segment 22. The connecting segment 23 is formed into an inverted "U" shape. A stopping block 24 projects from the outer edge of the connecting portion of the connecting segment 23 and the soldering segment 22. With the arrangement of the stopping block 24 and the fixing hole 221 of the soldering segment 22, the firmness of the connection between each terminal 20 and the insulating seat body can be enhanced.

The pressing element 30 is made of plastic materials and formed into a plate-like shape. Both sides of one end of the pressing element are provided with a projecting shaft 31 for pivoting into the connecting hole 14 of the insulating seat body 10. The middle part of the pressing element 30 crosses over the accommodating space 11 of the insulating seat body 10. The other end of the pressing element is provided with a locking groove 32 for extending downwardly and locking with the locking hook 15 of the insulating seat body 10.

Figure 4:
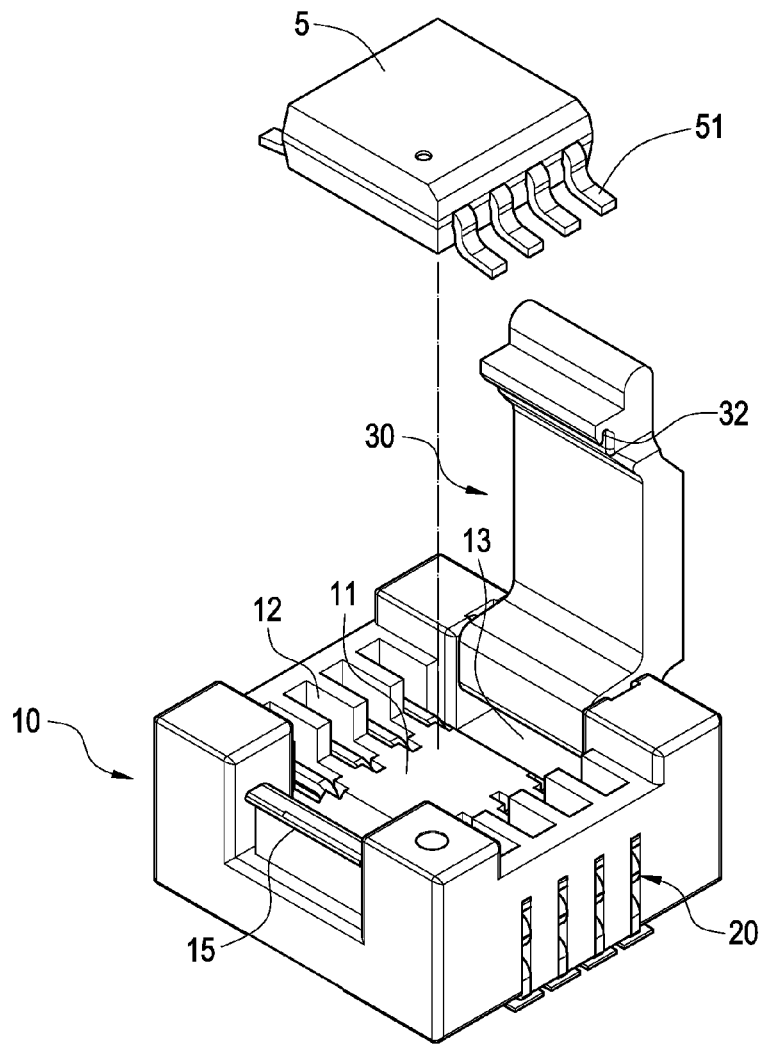
FIG. 4 is an assembled view showing the state in which the present invention is connected to a circuit board.
Figure 5:
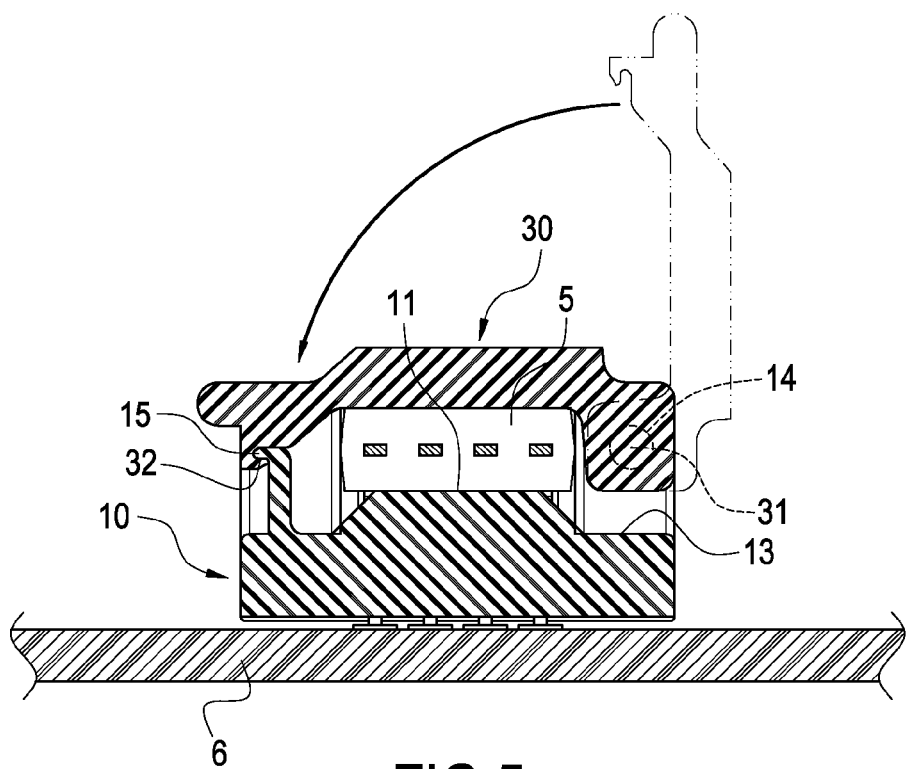
FIG. 5 is an assembled cross-sectional view of FIG. 4.
Figure 6:
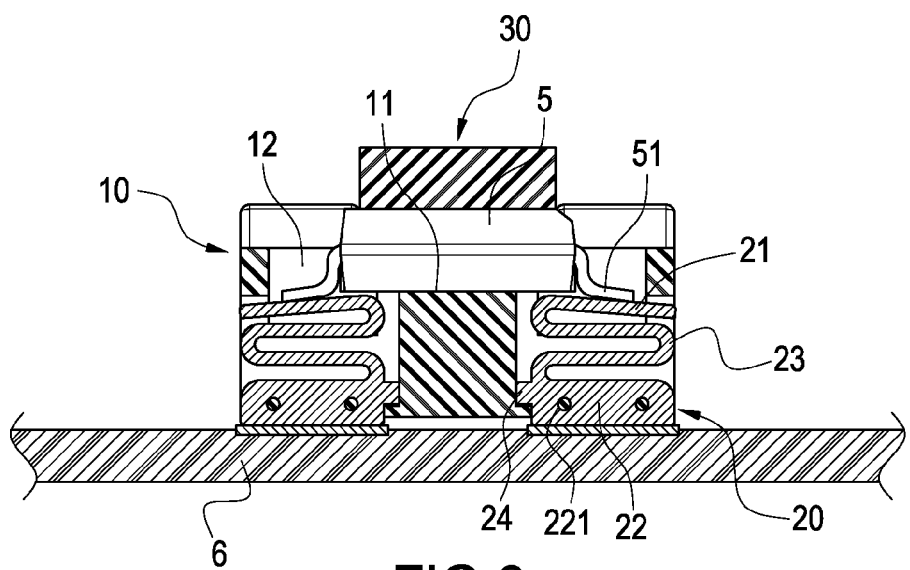
FIG. 6 is an assembled cross-sectional view of FIG. 4 taken from another direction.

FIG. 4 is an assembled view showing the state in which the present invention is connected to a circuit board. FIG. 5 is an assembled cross-sectional view of FIG. 4. FIG. 6 is an assembled cross-sectional view of FIG. 4 taken from another direction. The chip adapter seat of the present invention can be provided at a predetermined position on the circuit board 6. The positions at which the circuit board 6 is to be soldered are coated previously with soldering agent such as soldering paste. Then, the chip adapter seat is positioned on the circuit board 6 with the soldering segment 22 of each terminal 20 abutting against the connecting piece of the circuit board 6 and soldered thereto. Subsequently, a chip 5 is positioned into the accommodating space 11 of the insulating seat body 10. A plurality of pins 51 extends outwardly from two corresponding sides of the chip 5. Each pin 51 abuts against the contacting segment 21 of each corresponding terminal 20. Then, the pressing element 30 covers on the chip 5 by using the projecting shaft 31 as a center of rotation. The locking groove 32 of the pressing element 30 locks onto the locking hook 15 of the insulating seat body 10. At the same time, the middle part of the pressing element 30 just presses on the chip 5 to bring each pin 51 of the chip 5 into close contact with the contacting segment 21 of each terminal 20.

Figure 7:
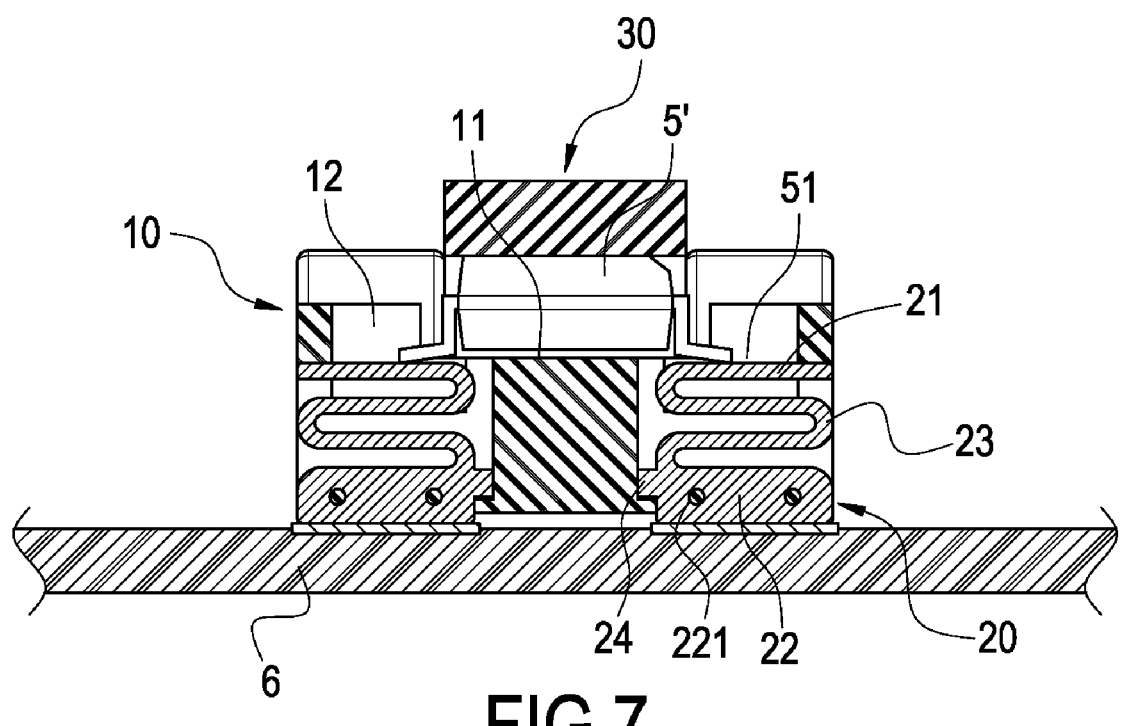
FIG. 7 is an assembled cross-sectional view showing the state in which another embodiment of the present invention is connected to a circuit board.

With reference to FIG. 7, it is an assembled cross-sectional view showing the state in which another embodiment of the present invention is connected to a circuit board. In the present invention, since the top face of the contacting segment 21 of each terminal 20 in a free state is located higher than the bottom surface of the accommodating space 11 of the insulating seat body 10, the chip adapter seat can not only be used for connecting to the above chip 5, but also to another chip 5' having a slightly smaller thickness than that of the chip 5. When the pressing element 30 is locked to the insulating seat body 10, the inner side face thereof abuts against the upper surface of the chip 5'. Although the bottom surface of the accommodating space 11 of the insulating seat body 10 does not contact with the bottom surface of the chip 5', the electrical connection between the pin 51 of the chip 5' and the contacting segment 22 of each terminal 20 can be still achieved. Therefore, the chip adapter seat of the present invention can be used for connecting to the chips 5, 5' having different thickness, thereby to increase the versatility.

Figure 8:
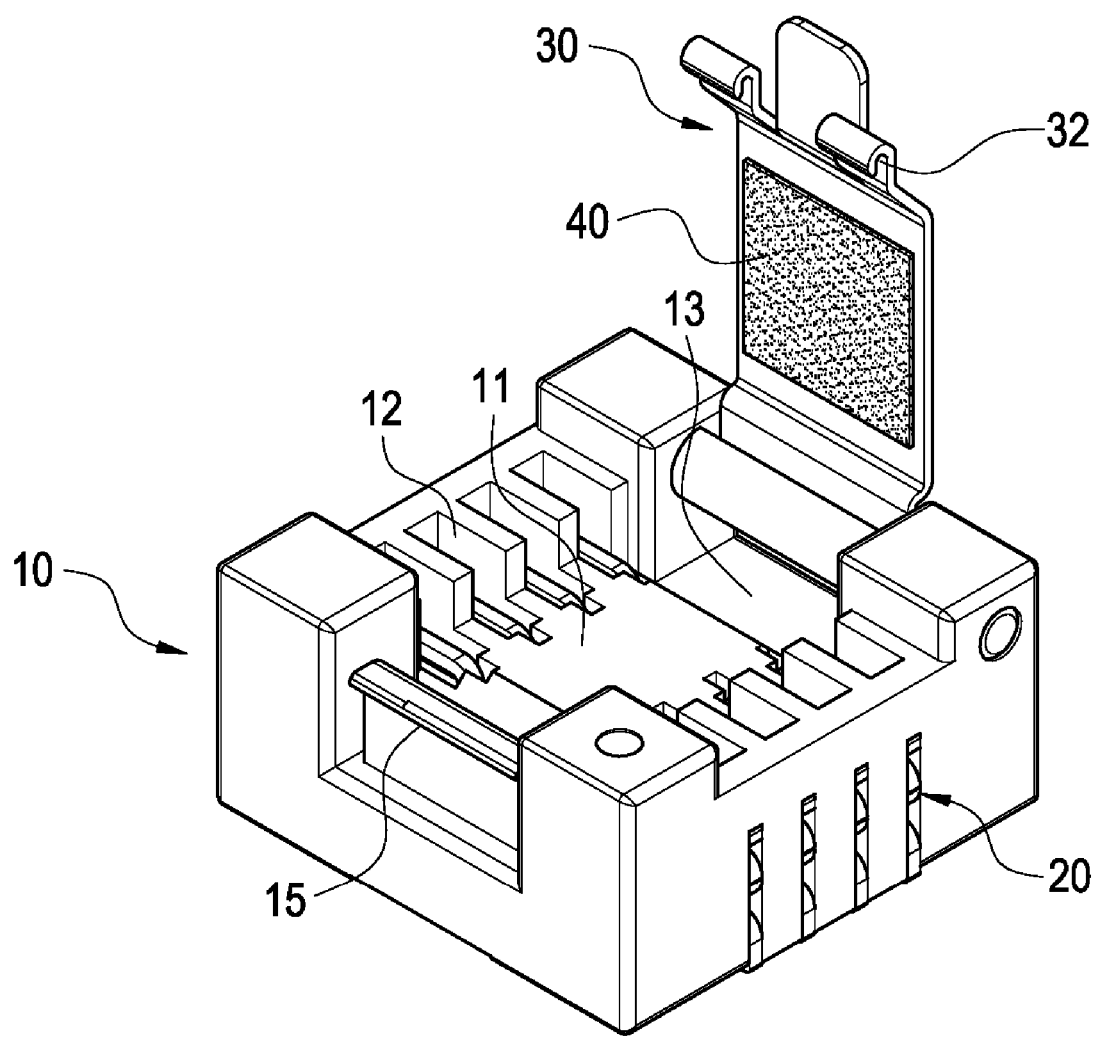
FIG. 8 is an assembled view showing another embodiment of the present invention.

With reference to FIG. 8, it is an assembled view showing another embodiment of the present invention. The pressing element 30 can be made of metallic materials. The inner surface thereof is adhered to a heat-conducting piece 40. The heat-conducting piece 40 can be heat-conducting glue, graphite patch or any other materials having good heat conductivity. With the above arrangement, not only the heat generated by the operation of the chip can be conducted out, but also the close abutment between the pressing element 30 and the chip 5 can be increased.

Figure 9:
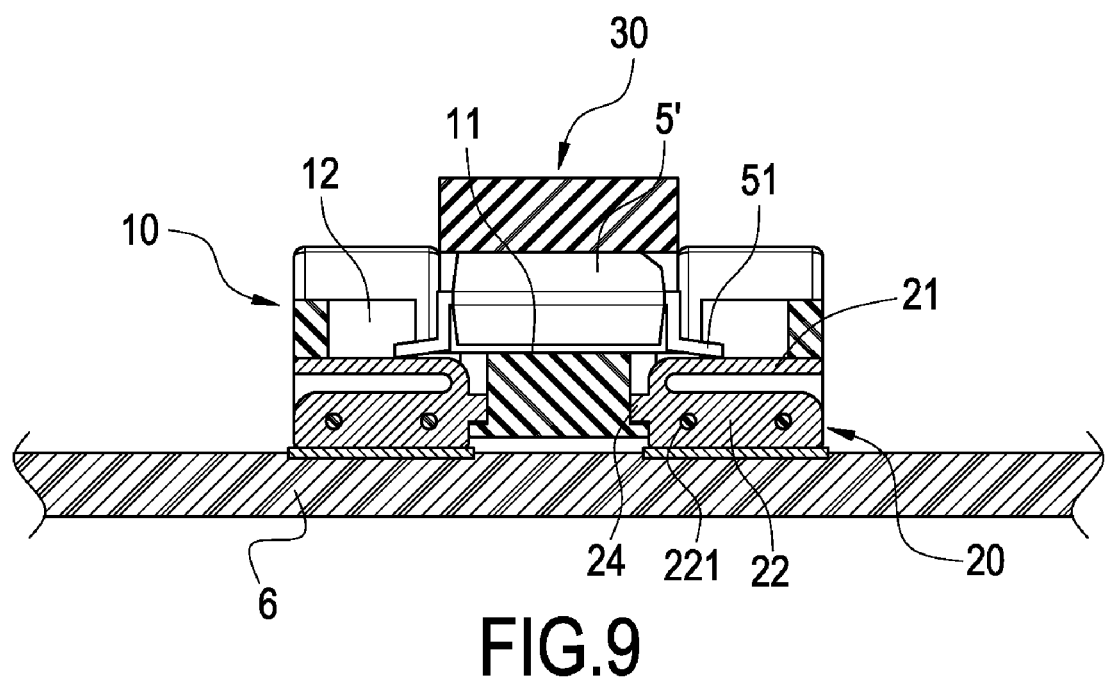
FIG. 9 is an assembled cross-sectional view showing the state in which a further embodiment of the present invention is connected to a circuit board.

With reference to FIG. 9, it is an assembled cross-sectional view showing the state in which a further embodiment of the present invention is connected to a circuit board. The terminal 20 comprises a contacting segment 21 and a soldering segment 22 bending downwardly from one side of the contacting segment 21. The contacting segment 21 is electrically connected to the pin 51 of the chip 5'. The soldering segment 22 is fixedly soldered on the circuit board 6. In this way, the total height of the chip adapter seat can be greatly reduced.

According to the above, the chip adapter seat of the present invent indeed involves the industrial applicability, novelty and inventive steps. Further, since the construction of the present invention has not been published or put to public use prior to applying for patent, the present invention conforms to the requirements for a utility model patent.

Although the present invention has been described with reference to the foregoing preferred embodiments, it will be understood that the invention is not limited to the details thereof. Various equivalent variations and modifications can still be occurred to those skilled in this art in view of the teachings of the present invention. Thus, all such variations and equivalent modifications are also embraced within the scope of the invention as defined in the appended claims.

What is claimed is:

1. A chip adapter seat, comprising:
an insulating seat body having an accommodating space for accommodating a chip, a plurality of terminal-receiving grooves provided respectively on two corresponding sides of the accommodating space to correspond to chip pins extending from a chip body of the chip;
a plurality of terminals provided correspondingly in the terminal-receiving grooves of the insulating seat body, one end of each terminal electrically connected to the chip pin, the other end thereof projecting from the outside of the periphery of the insulating seat body; and
a pressing element connected above the accommodating space of the insulating seat body, with a middle part thereof crossing over the accommodating space for pressing on a top surface of the chip body, instead of pressing on the chip pins of the chip in the accommodating space of the insulating seat body to bring each chip pin of the chip into close contact with each terminal, wherein the terminal comprises a contacting segment, a soldering segment and a connecting segment formed between the contacting segment and the soldering segment, the contacting segment is electrically connected to each pin of the chip, and the soldering segment projects from the outside of the periphery of the insulating seat body, and wherein the contacting segment and the connecting segment together are formed substantially in S-shape.

2. The chip adapter seat according to claim 1, wherein the soldering segment is provided with fixing holes, and a stopping block projects from the outer edges of the connection between the connecting segment and the soldering segment.

3. The chip adapter seat according to claim 1, wherein the terminal comprises a contacting segment and a soldering segment bending downwardly from one side of the contacting segment, the contacting segment is electrically connected to each pin of the chip, and the soldering segment projects from the outside of the periphery of the insulating seat body.

4. The chip adapter seat according to claim 1, wherein the pressing element is made of plastic materials.

5. The chip adapter seat according to claim 1, wherein one side adjacent to the terminal-receiving grooves of the insulating seat body is formed with a recessed trough, both side wall faces of the recessed trough are provided respectively with a connecting hole, and one end of the pressing element is provided with a projecting shaft for extending and connecting to the connecting hole.

6. The chip adapter seat according to claim 5, wherein one side of the insulating seat body opposing to the recessed trough is provided with a locking hook, and the other end of the pressing element is provided with a locking groove for locking the locking hook.

7. The chip adapter seat according to claim 1, wherein the pressing element is made of metallic materials.

8. The chip adapter seat according to claim 7, further comprising a heat-conducting piece adhered to the inner surface of the pressing element.

9. The chip adapter seat according to claim 8, wherein the heat-conducting piece is any one of heat-conducting glue or graphite patch.

10. A chip adapter seat, comprising:
an insulating seat body having an accommodating space, a plurality of terminal-receiving grooves provided respectively at intervals on two corresponding sides of the accommodating space;
a plurality of terminals provided correspondingly in the terminal-receiving grooves of the insulating seat body, one end of each terminal projecting from the bottom surface of the accommodating space of the insulating seat body, the other end thereof projecting from the outside of the periphery of the insulating seat body; and
a pressing element connected above the accommodating space of the insulating seat body, wherein the terminal comprises a contacting segment, a soldering segment and a connecting segment formed between the contacting segment and the soldering segment, the contacting segment is electrically connected to each pin of the chip, and the soldering segment projects from the outside of the periphery of the insulating seat body, and wherein the contacting segment and the connecting segment together are formed substantially in S-shape.

11. The chip adapter seat according to claim 10, wherein the soldering segment is provided with fixing holes, and a stopping block projects from the outer edges of the connection between the connecting segment and the soldering segment.

12. The chip adapter seat according to claim 10, wherein the terminal comprises a contacting segment and a soldering segment bending downwardly from one side of the contacting segment, the top surface of the contacting segment in a free state is located higher than the bottom surface of the accommodating space of the insulating seat body, and the soldering segment projects from the outside of the periphery of the insulating seat body.

13. The chip adapter seat according to claim 10, wherein the pressing element is made of plastic materials.

14. The chip adapter seat according to claim 10, wherein one side adjacent to the terminal-receiving grooves of the insulating seat body is formed with a recessed trough, both side wall faces of the recessed trough are provided respectively with a connecting hole, and one end of the pressing element is provided with a projecting shaft for extending and connecting to the connecting hole.

15. The chip adapter seat according to claim 14, wherein one side of the insulating seat body opposing to the recessed trough is provided with a locking hook, and the other end of the pressing element is provided with a locking groove for locking the locking hook.

16. The chip adapter seat according to claim 10, wherein the pressing element is made of metallic materials.

17. The chip adapter seat according to claim 16, further comprising a heat-conducting piece adhered to the inner surface of the pressing element.

18. The chip adapter seat according to claim 17, wherein the heat-conducting piece is any one of heat-conducting glue or graphite patch.

* * * * *

UNITED STATES PATENT AND TRADEMARK OFFICE
CERTIFICATE OF CORRECTION

PATENT NO. : 7,297,011 B2 Page 1 of 1
APPLICATION NO. : 11/459486
DATED : November 20, 2007
INVENTOR(S) : Chih-Ming Lai It is certified that error appears in the above-identified patent and that said Letters Patent is hereby corrected as shown below:

Title Page, item 73 Assignee name, please replace "Giga-Gyte" with --Giga-Byte--

Signed and Sealed this

Eighth Day of April, 2008

JON W. DUDAS
*Director of the United States Patent and Trademark Office*